United States Patent
Hayashi et al.

(10) Patent No.: US 7,043,993 B2
(45) Date of Patent: May 16, 2006

(54) PRESSURE SENSOR DEVICE HAVING TEMPERATURE SENSOR

(75) Inventors: Kyutaro Hayashi, Takahama (JP); Takashige Saitou, Ama-gun (JP); Yukihiro Kato, Kariya (JP)

(73) Assignee: Denso Corporation, Kariya (JP)

( * ) Notice: Subject to any disclaimer, the term of this patent is extended or adjusted under 35 U.S.C. 154(b) by 139 days.

(21) Appl. No.: 10/690,812

(22) Filed: Oct. 23, 2003

(65) Prior Publication Data

US 2004/0134282 A1 Jul. 15, 2004

(30) Foreign Application Priority Data

Oct. 23, 2002 (JP) .............. 2002-308982
Mar. 19, 2003 (JP) .............. 2003-075019

(51) Int. Cl.
*G01L 19/04* (2006.01)

(52) U.S. Cl. .............. 73/708; 73/717
(58) Field of Classification Search .............. 73/700, 73/708, 716, 717, 723, 720, 721
See application file for complete search history.

(56) References Cited

U.S. PATENT DOCUMENTS

| | | | |
|---|---|---|---|
| 5,386,730 A | * | 2/1995 | Ikeda et al. .............. 73/706 |
| 5,449,535 A | * | 9/1995 | Streater .............. 427/582 |
| 5,661,244 A | * | 8/1997 | Nishimura et al. .............. 73/706 |
| 5,948,989 A | * | 9/1999 | Ichikawa et al. .............. 73/708 |
| 5,974,893 A | | 11/1999 | Balcarek et al. |
| 6,003,379 A | * | 12/1999 | Ichikawa et al. .............. 73/708 |
| 6,141,020 A | * | 10/2000 | Larson .............. 345/501 |
| 6,142,020 A | | 11/2000 | Kim et al. |
| 6,212,946 B1 | | 4/2001 | Naegele et al. |
| 6,267,010 B1 | | 7/2001 | Hatanaka et al. |
| 6,272,913 B1 | | 8/2001 | Naegele et al. |
| 6,439,056 B1 | * | 8/2002 | Jonsson .............. 73/708 |
| 2002/0112610 A1 | | 8/2002 | Baba et al. |

FOREIGN PATENT DOCUMENTS

| | | |
|---|---|---|
| JP | A-S54-69472 | 6/1979 |
| JP | A-H05-340822 | 12/1993 |
| JP | U-H06-65840 | 9/1994 |
| JP | A-H09-159545 | 6/1997 |

* cited by examiner

*Primary Examiner*—Michael Cygan
*Assistant Examiner*—Andre Allen
(74) *Attorney, Agent, or Firm*—Posz Law Group, PLC

(57) ABSTRACT

A pressure sensor device having a temperature sensor includes a pressure sensor, a temperature sensor, a sensor casing for accommodating the pressure sensor and a connector pin for electrically connecting the pressure sensor and an outside circuit, and a port mounted on the sensor casing and having a pressure introduction port for introducing a measuring object to the pressure sensor. The temperature sensor is disposed in the pressure introduction port, and electrically connects to the connector pin through a lead wire. The lead wire with the temperature sensor is supported by a connection portion disposed between the connector pin and the lead wire. The lead wire has a buffer disposed between the lead wire and a part of the pressure introduction port for reducing a vibration of both the temperature sensor and the lead wire.

22 Claims, 5 Drawing Sheets

PRESSURE SENSOR DEVICE HAVING TEMPERATURE SENSOR

CROSS REFERENCE TO RELATED APPLICATION

This application is based on Japanese Patent Applications No. 2002-308982 filed on Oct. 23, 2002, and No. 2003-75019 filed on Mar. 19, 2003, the disclosures of which are incorporated herein by reference.

FIELD OF THE INVENTION

The present invention relates to a pressure sensor device for detecting pressure of a measuring object, and more particularly to a pressure sensor device having a temperature sensor for detecting both pressure and temperature of the measuring object.

BACKGROUND OF THE INVENTION

A pressure sensor device having a temperature sensor, i.e., the pressure sensor device integrated with the temperature sensor, is, for example, used for a vehicle. The device detects both pressure and temperature of intake air as a measuring object in an intake manifold of the vehicle, so that the device outputs a measurement signal to a controller. The controller calculates and outputs a control signal to an engine of the vehicle so that the engine is controlled.

The pressure sensor device includes a sensor casing, a connector pin, a pressure sensor, and a temperature sensor. The connector pin connects to an outside circuit such as an electronic control unit (i.e., ECU) as a controller of the vehicle. Each of the pressure sensor and the temperature sensor electrically connects to the connector pin, respectively. Particularly, the temperature sensor connects to the connector pin at a connection portion through a lead wire. The lead wire is protruded from the connection portion. The temperature sensor is disposed on one end of the lead wire, and the connection portion is disposed on the other end of the lead wire. Thus, the temperature sensor is accommodated in a temperature sensor chamber so that the temperature sensor is supported by the connection portion through the lead wire. In the other words, the temperature sensor is floated in the temperature sensor chamber with using the lead wire as a support.

However, since the connection portion is the support of the temperature sensor, the temperature sensor is vibrated sympathetically with the connection portion as a supporting point in a case where a vibration is applied to the sensor device. Accordingly, a stress is applied to the connection portion repeatedly, so that the lead wire may be broken at the connection portion. Moreover, the lead wire or the temperature sensor may hit an inner wall of the temperature sensor chamber, so that the lead wire or the temperature sensor is broken.

SUMMARY OF THE INVENTION

In view of the above problem, it is an object of the present invention to provide a pressure sensor device having a temperature sensor, the temperature sensor of which is limited to vibrate.

A pressure sensor device having a temperature sensor includes a pressure sensor for detecting pressure of a measuring object, a temperature sensor for detecting temperature of the measuring object, a sensor casing for accommodating the pressure sensor and a connector pin, which electrically connects the pressure sensor and an outside circuit, a port mounted on the sensor casing and having a pressure introduction port for introducing the measuring object to the pressure sensor disposed in the sensor casing, and a vibration reduction means for reducing a vibration of both the temperature sensor and the lead wire. The temperature sensor is disposed in the pressure introduction port, and electrically connects to the connector pin through a lead wire. Both the temperature sensor and the lead wire are supported by a connection portion, which is disposed between the connector pin and the lead wire.

In the above device, the vibration of the lead wire with the temperature sensor is reduced by the vibration reduction means even when a vibration is applied to the device. Thus, endurance of the device is improved.

Preferably, the vibration reduction means is provided by a buffer disposed between the lead wire and a part of the pressure introduction port. In this case, the buffer does not completely close the pressure introduction port. Therefore, the measuring object passes through the buffer so that the temperature sensor detects the newly introduced measuring object flowing through the pressure introduction port. Moreover, even when a contamination contaminated into the pressure introduction port, the contamination is discharged through the buffer together with the measuring object flowing therethrough.

Preferably, the pressure introduction port includes a partition plate for separating at least a part of the pressure introduction port into two parts. The partition is disposed along with an introducing direction of the measuring object. One part of the pressure introduction port is a temperature sensor chamber for accommodating the temperature sensor. In this case, the buffer is easily inserted between the lead wire and a part of the pressure introduction port.

Preferably, the vibration reduction means is provided such that at least one of the temperature sensor or the lead wire is insert-molded into the port so as to reduce the vibration. More preferably, both the sensor casing and the port provide a pressure chamber for introducing the measuring object therein, and the lead wire and the connector pin are connected at a connection portion, which is disposed outside the pressure chamber. In this case, at least one of the lead wire or the temperature sensor is integrated into the port so that both the lead wire and the temperature sensor are preliminarily positioned at a predetermined position. Therefore, the lead wire and the connector pin can be connected at the outside of the pressure chamber, so that the connection portion is not contaminated. Thus, a protection for the connection portion can be formed of epoxy resin or silicon resin, which has less chemical resistance but less expensive.

Further, a pressure sensor device having a temperature sensor includes a pressure sensor, a temperature sensor attached to a lead wire, a casing for accommodating the pressure sensor and a connector pin for connecting both the pressure sensor and the temperature sensor to an outside circuit, a passage disposed in the casing for introducing a measuring object to the pressure sensor, and a vibration reduction means for reducing a vibration of the lead wire with the temperature sensor. The lead wire is supported by a connection portion between the connector pin and the lead wire so that the lead wire is protruded in the port.

In the above device, the vibration of the lead wire with the temperature sensor is reduced by the vibration reduction means even when a vibration is applied to the device. Thus, endurance of the device is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
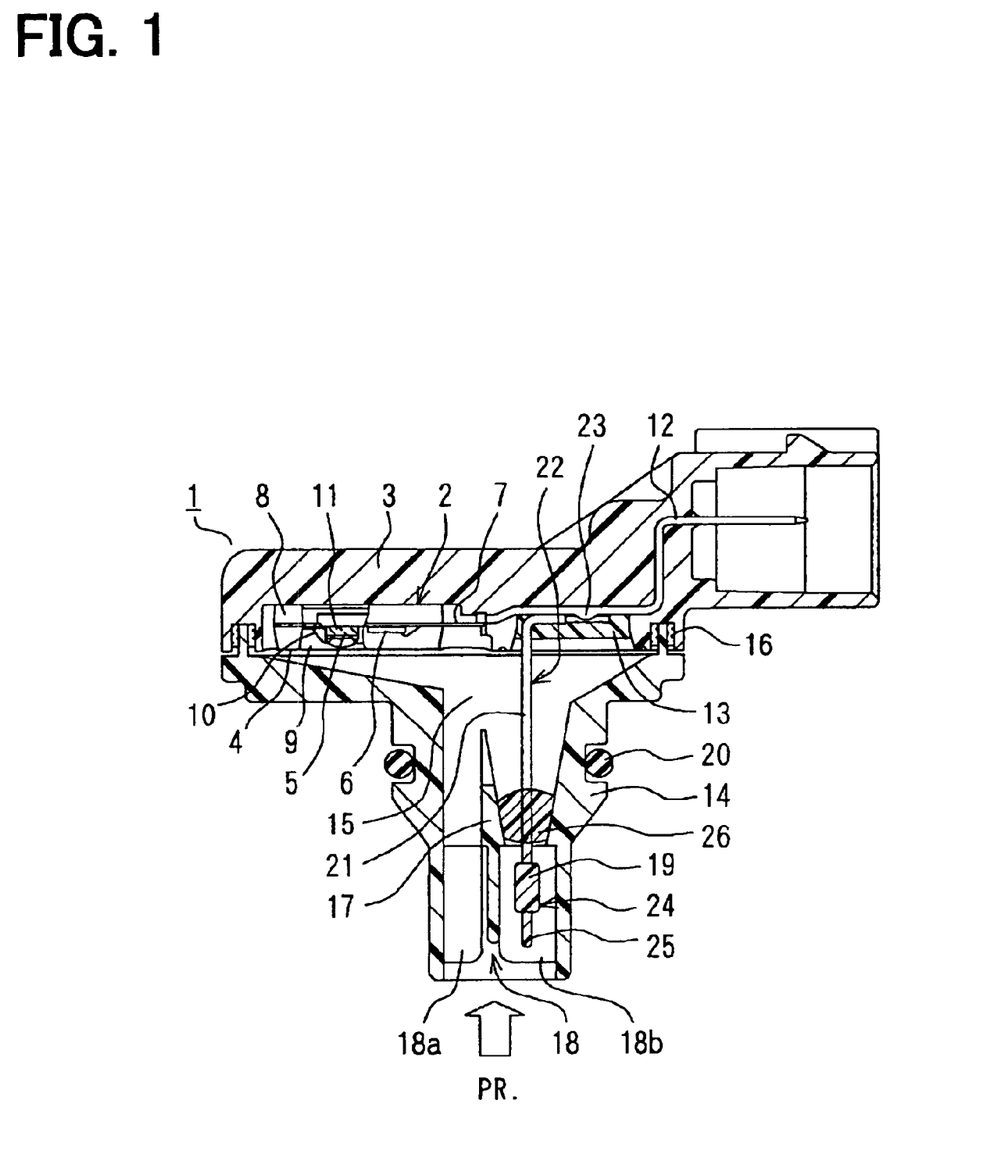
FIG. 1 is a schematic cross-sectional view showing a pressure sensor device having a temperature sensor according to a first embodiment of the present invention.

A pressure sensor device 1 having a temperature sensor according to a first embodiment of the present invention is shown in FIG. 1. The pressure sensor device 1 detects, for example, both pressure and temperature of intake air as a measuring object in an intake manifold of a vehicle. The device 1 includes a sensor casing 3. A mold IC (i.e., integrated circuit) 2 as a pressure detection element having a pressure sensor chip 5 is disposed in the sensor casing 3. The mold IC 2 includes a fixation portion 4 having a concavity, in which the pressure sensor chip 5 is mounted. The pressure sensor chip 5 detects the pressure of the measuring object. The mold IC 2 further includes a signal processor IC 6 and a lead frame 7.

The signal processor IC 6 magnifies a measurement signal outputted from the pressure sensor chip 5. The lead frame 7 outputs a magnified measurement signal from the signal processor IC 6. The signal processor IC 6 and the lead frame 7 are molded with mold resin 8 such as an epoxy resin material, so that both the signal processor IC 6 and the lead frame 7 are protected. Thus, the mold IC 2 is formed and molded.

The sensor casing 3 is made of heat resistant resin such as poly-buthylene terephthalate (i.e., PBT) or poly-phenylene sulfide (i.e., PPS). A protection member 9 covers the fixation portion 4 so that the pressure sensor chip 5 is protected by the protection 9. Therefore, the pressure sensor chip 5 can be operated under an excellent performance.

A pressure receiving surface of the pressure sensor chip 5 faces an opening portion of the fixation portion 4 so that the pressure is applied to the pressure receiving surface. The pressure sensor chip 5 and the lead frame 7 are electrically connected together with a wire 10 such as gold by a wire bonding method. The pressure sensor chip 5 includes a diaphragm made of single crystal silicon and a plurality of diffusion resistances disposed on the diaphragm. The diffusion resistances are connected together with a bridge connection. The pressure sensor chip 5 is, for example, adhered to a base 11 by a glass bonding method and the like. The base 11 is made of glass. The base 11 is also adhered to a bottom surface of the fixation portion 4 with using silicon resin and the like.

The lead frame 7 electrically connects to a connector pin 12, which connects to an outside circuit (not shown) such as ECU of the vehicle. The connection portion between the lead frame 7 and the connector pin 12 is sealed with a potting member 13 made of a fluorine compound, a polyamide, an epoxy resin and the like. Preferably, the potting member 13 is made of fluorine resin having high chemical resistance.

An inlet port 14 is mounted on the sensor casing 3 through an adhesive 16 so that a pressure chamber 15 is formed between the sensor casing 3 and the inlet port 14. The inlet port 14 is made of resin material having high chemical resistance such as PBT or PPS. The adhesive 16 has high elasticity and high chemical resistance such as hard epoxy resin and the like.

The inlet port 14 protrudes to the outside, which is opposite to the sensor casing 3. A pressure introduction port 18 is disposed inside the inlet port 14. The pressure introduction port 18 leads from the protruded end of the inlet port 14 to the pressure chamber 15. The pressure introduction port 18 is divided into two regions by a partition plate 17, which is disposed along with an introduction direction of the measuring object. One region of the pressure introduction port 18 is a pressure introduction passage 18a for introducing the measuring object to the pressure receiving surface of the pressure sensor chip 5. The other region of the pressure introduction port 18 is a temperature sensor chamber 18b for accommodating a thermistor as a temperature sensor chip 19.

An O-ring 20 is disposed outside the inlet port 14. The pressure sensor 1 is mounted in a mounting portion of the vehicle (not shown) through the O-ring 20 air-tightly. The pressure introduction passage 18a and the temperature sensor chamber 18b are divided by the partition plate 17 at the protrusion portion of the inlet port 14. However, they are integrated into the pressure chamber 15 inside the inlet port 14. The partition plate 17 is integrally formed together with the inlet port 14.

The temperature sensor chip 19 disposed in the temperature sensor chamber 18b is made of metallic material such as Co, Mn and Ni. The temperature sensor chip 19 electrically connects to a lead wire 22 covered with a protection tube 21. The lead wire 22 is fixed to the connector pin 12 at a connection portion 23 by using welding method. The connector pin 12 is insert-molded into the sensor casing 3. The lead wire 22 is covered with the protection tube 21 except for the connection portion 23 and its surrounding portion. The protection tube 21 is made of polyimide and the like.

Therefore, the temperature sensor 24 composed of the lead wire 22 and the temperature sensor chip 19 has only one connection point, which is the connection point 23. The temperature sensor 24 is protruded into the temperature sensor chamber 18b of the inlet port 14 with being supported by the connection portion 23 as a support. Here, the connection portion 23 and its surrounding portion are covered with the potting member 13, so that they are protected from the usage environment. The temperature sensor chip 19 and its surrounding portion are covered with a coating 25 such as polyamide for protecting.

When the pressure is applied to the pressure sensor device 1 in a direction of an arrow shown in FIG. 1, the measuring object is introduced into the pressure receiving surface of the pressure sensor chip 5 in the sensor casing 3 through the pressure introduction passage 18a of the inlet port 14. A diaphragm of the pressure sensor chip 5 is deformed in proportion to the pressure of the measuring object. A value of a diffusion resistance (not shown) of the pressure sensor chip 5 changes in proportion to the deformation of the diaphragm. This value change is measured by a bridge circuit, so that the bridge circuit outputs a signal voltage. Then, the signal voltage is magnified with the signal processor IC 6, and the magnified signal voltage is outputted to the outside circuit through the lead frame 7 and the connector pin 12. The temperature of the measuring object is detected by the temperature sensor 24, which is disposed near a flow of the measuring object. A temperature signal is outputted to the outside circuit through the connector pin 12.

Figure 7:
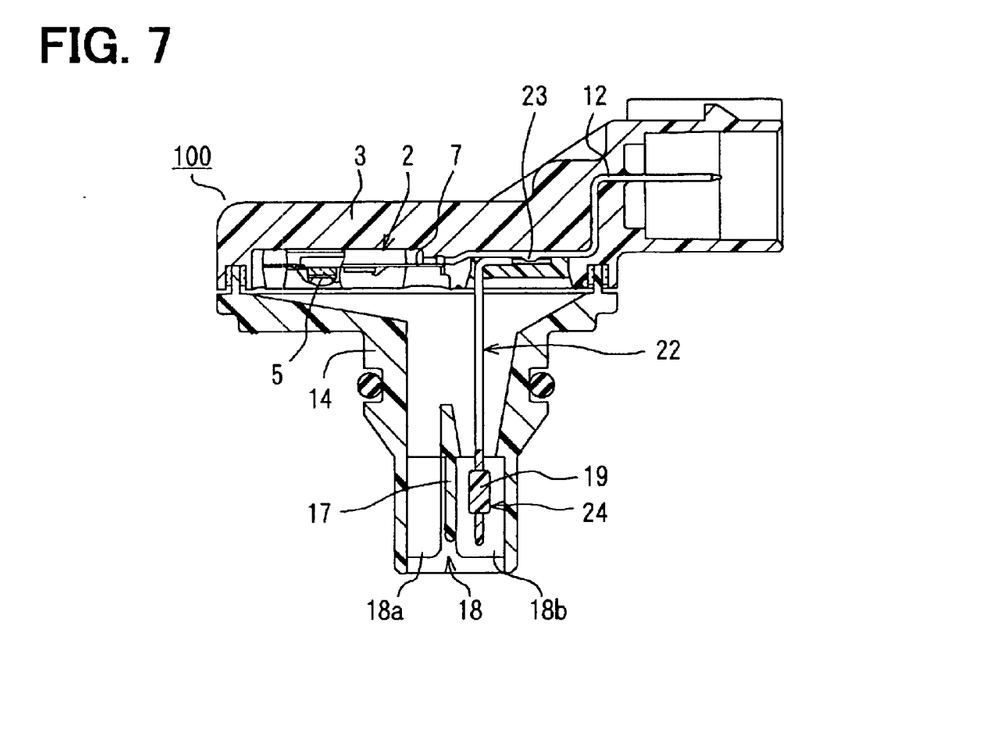
FIG. 7 is a cross-sectional view showing a pressure sensor device according to a comparison of the first embodiment.

Here, another pressure sensor 100 having a temperature sensor as a comparison of the above temperature sensor 1 is shown in FIG. 7. In the pressure sensor 100, the temperature sensor 24 has the connection portion 23 for connecting between the temperature sensor 24 and the connector pin 12 as only one support. When vibration is applied to the pressure sensor 1, the temperature sensor 24 vibrates sympathetically with using the connection portion as a supporting point. Accordingly, the connection portion 23 of the lead wire 22 is applied to a stress repeatedly. Moreover, the lead wire 22 or the temperature sensor 24 may hit an inner wall of the temperature sensor chamber 18b, so that the lead wire 22 or the temperature sensor 24 is broken.

In other words, the temperature sensor 100 is supported with the only one support, i.e., the connection portion 23, so that the temperature sensor 24 hangs from the connection portion 23 in the temperature sensor chamber 18b.

However, the pressure sensor 1 according to the first embodiment includes a buffer 26 for protecting the vibration of the temperature sensor 24 so that the lead wire 22 and the temperature sensor 24 is protected from being broken. The buffer 26 is made of resin material, and disposed between the lead wire 22 and a part of the inner wall of the temperature sensor chamber 18b.

The resin material for forming the buffer 26 is a gel state partially-hydrogenated resin, for example, epoxy resin. Preferably, the resin material is a hot melt adhesive, which is thermoplastic resin adhesive without any solvent. Here, the hot melt adhesive has a low viscosity in case of melting state. Therefore, the hot melt adhesive in case of melting state can be filled in a predetermined portion, so that a stress of the lead wire 22 generated in case of filling the hot melt adhesive is reduced. Moreover, the hot melt adhesive is hardened immediately by cooling with atmosphere, the inner wall of the inlet port 14 and the contact surface of the lead wire 22, so that the hot melt adhesive is limited to flow out of the inlet port 14. The hot melt adhesive is, for example, polyurethane, polyester and polyamide. Another material can be used as the material for forming the buffer 26, as long as the material has sufficient resistance to the usage environment and suppresses the vibration of the temperature sensor 24.

Figure 2A:
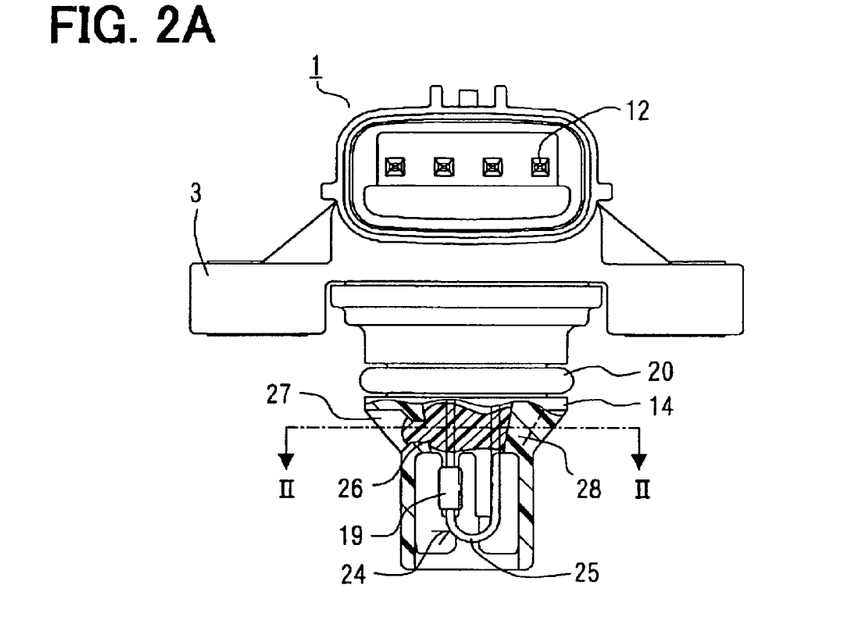
FIG. 2A is a partial cross-sectional view showing the pressure sensor device according to the first embodiment.
Figure 2B:
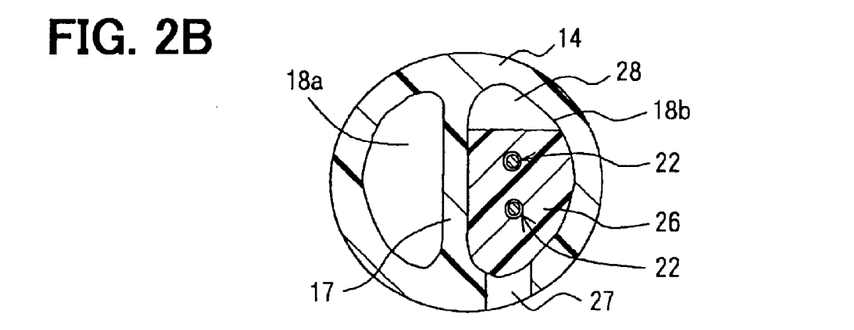
FIG. 2B is a cross-sectional view showing the pressure sensor device taken along line II—II in FIG. 2A, according to the first embodiment.

The resin material for forming the buffer 26 can be filled from the temperature sensor chamber 18b of the inlet portion 14. However, when a distance between the top of the inlet portion 14 and the buffer 26 is long and the temperature sensor chip 19 is disposed therebetween, it is difficult to fill the resin material from the temperature sensor chamber 18b. In this case, the pressure sensor 1 further includes an introduction port 27 disposed in a part of the inlet portion 14, as shown in FIGS. 2A and 2B. The resin material is filled between the lead wire 22 and the inner wall of the temperature sensor chamber 18b through the introduction port 27.

Here, the protrusion portion of the inlet port 14 is inserted into the mounting portion (not shown). The pressure sensor 1 is mounted on the mounting portion air-tightly by using the O-ring 20, which is disposed outside the inlet port 14. Therefore, the introduction port 27 is required to be disposed on the pressure introduction port side from the O-ring 20, so as to keep the pressure in the pressure chamber 15 of the pressure sensor 1. In other words, the introduction port 27 is disposed downside from the O-ring 20 in FIG. 2A.

Preferably, the buffer 26 is disposed between a part of the temperature sensor chamber 18b of the inlet port 14 and the lead wire 22. In other words, the cross-sectional plane of the temperature sensor chamber 18b is not closeped completely, so that the buffer 26 has a communicating hole 28 for passing the measuring object therethrough. If the cross-sectional plane of the temperature sensor chamber 18b is closeped completely, a contamination is stocked on the buffer 26 in a case where the contamination in oil or fuel penetrates into the pressure chamber 15. The buffer 26 and the protection tube 21 of the lead wire 22 are contaminated by the contamination. Thus, the buffer 26 and the protection tube 21 of the lead wire 22 are damaged, so that the temperature sensor 24 may vibrate or fail because of the damage. However, the buffer 26 has the communicating hole 28 so that the contamination is discharged through the communicating hole 28. Therefore, the buffer 26 and the protection tube 21 of the lead wire 22 are limited to be damaged. Moreover, the measuring object can pass through the temperature sensor chamber 18b with using the communicating hole 28, so that the temperature sensor 24 always detects the measuring object, which is newly introduced into the temperature sensor chamber 18b. In other words, the temperature sensor 24 always detects the measuring object, which has almost the same state as the measuring object detected by the pressure sensor chip 5.

Thus, in the pressure sensor device 1 having the temperature sensor, the buffer 26 is disposed between the lead wire 22 of the temperature sensor 24 and the inner wall of the temperature sensor chamber 18b of the inlet port 14, so that the vibration of the temperature sensor 24 is reduced, and the endurance of the temperature sensor 24 is increased.

Here, to lower the manufacturing cost, the introduction port 27 is formed simultaneously with the inlet port 14, which is integrally formed of resin. However, the introduction port 27 can be formed after the inlet port 14 is formed.

Figure 2C:
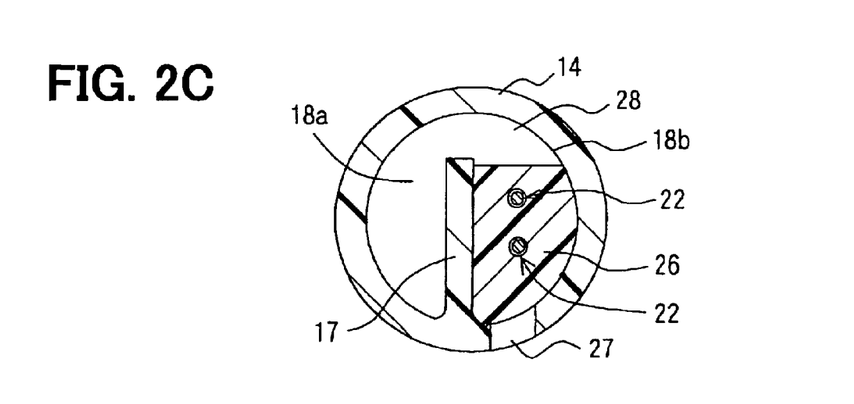
FIG. 2C is a partial cross-sectional view showing the pressure sensor device taken along line II—II in FIG. 2A, according to a modification of the first embodiment.

Moreover, although the introduction port 27 is disposed at a certain position shown in FIG. 2B, the introduction port 27 can be disposed at another position, as long as the resin material composing the buffer 26 can be filled into the temperature sensor chamber 18b. Although the partition plate 17 completely separates the pressure introduction passage 18a and the temperature sensor chamber 18b, the partition plate 17 partially separates the pressure introduction port 18, as shown in FIG. 2C. In this case, the pressure introduction passage 18a is communicated with a part of the temperature sensor chamber 18b.

In this embodiment, the partition plate 17 divides the pressure introduction port 18 into two regions. One region is the temperature sensor chamber 18b for accommodating the temperature sensor 24. However, the inlet port 14 can have at least one pressure introduction port 18. In this case, the temperature sensor 24 with the buffer 26 is disposed between the pressure sensor 5 and the pressure introduction port 18. Therefore, a pass flowing the measuring object to the pressure sensor chip 5 is interrupted by the temperature sensor 24 with the buffer 26. Thus, the communicating hole 28 is necessitated to introduce the measuring object to the pressure receiving surface of the pressure sensor chip 5.

(Second Embodiment)

Figure 3:
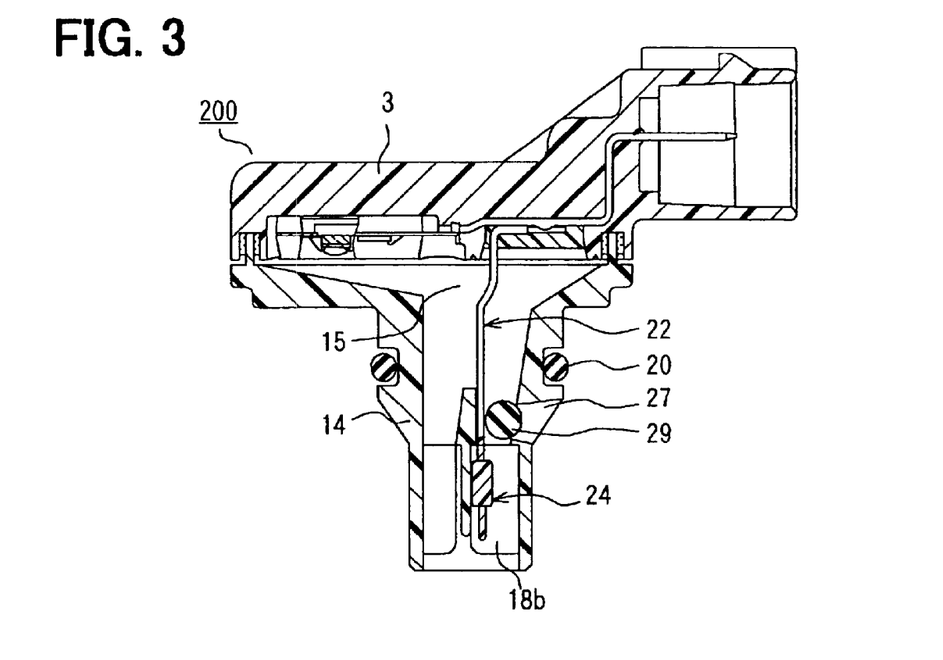
FIG. 3 is a cross-sectional view showing a pressure sensor device according to a second embodiment of the present invention.

A pressure sensor device 200 having a temperature sensor according to a second embodiment of the present invention is shown in FIG. 3. The lead wire 22 of the temperature sensor 24 follows the inner wall of the temperature sensor chamber 18b. An elastic member 29 having a ball shape is disposed in the temperature sensor chamber 18b so that the elastic member 29 suppresses the vibration of the lead wire 22. The elastic member 29 is inserted into the temperature sensor chamber 18b through the introduction port 27. At this time, the elastic member 29 deforms so as to be inserted into the temperature sensor chamber 18b. The elastic member 29 is disposed between the lead wire 22 and the inside end of the introduction port 27, so that the lead wire 22 is press-contacted to the inner wall of the temperature sensor chamber 18b. Thus, the vibration of the temperature sensor 24 is reduced. The elastic member 29 does not have fluidity such as the resin material, so that the elastic member 27 does not flow out from the temperature sensor chamber 18b of the inlet port 14 when the elastic member 29 is inserted through the introduction port 27. The introduction port 27 is disposed downside from the O-ring 20 shown in FIG. 3 so that the pressure in the pressure chamber 15 is stabilized.

The elastic member 29 is made of rubber such as acrylonitrile butadiene rubber (i.e., NBR), hydrogenated acrylonitrile butadiene rubber (i.e., H-NBR), fluorine rubber, silicon rubber, and acrylic rubber. However, the elastic member 29 can be made of another material as long as the material has a sufficient elasticity.

Thus, the elastic member 29 can suppress the vibration of the temperature sensor 24, so that the endurance of the temperature sensor 24 is improved.

Although the elastic member 29 has a ball shape, the elastic member 29 can have another shape as long as the elastic member 29 having a sufficient elasticity fixes the lead wire 22 to the inner wall of the temperature sensor chamber 18b. Preferably, the elastic member 29 does not close the cross-sectional plane of the temperature sensor chamber 18b completely.

Although the elastic member 29 is inserted into the temperature sensor chamber 18b through the introduction port 27, the elastic member having a ring shape is preliminarily inserted into the lead wire 22. After that, the inlet port 14 is adhered to the sensor casing 3.

(Third Embodiment)

Figure 4:
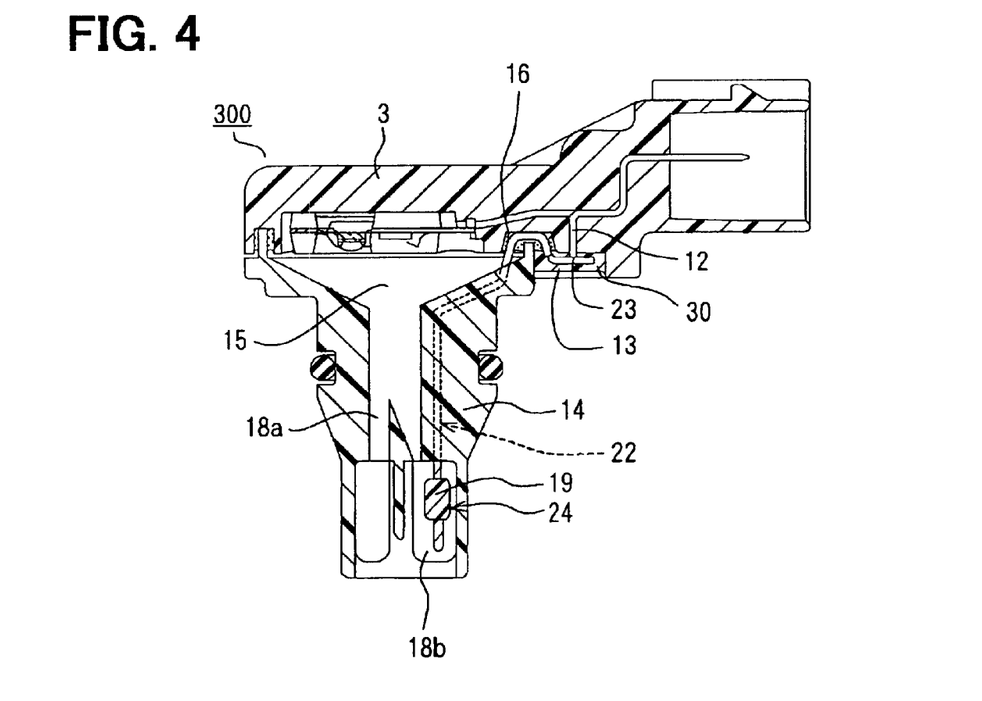
FIG. 4 is a cross-sectional view showing a pressure sensor device according to a third embodiment of the present invention.

A pressure sensor device 300 having a temperature sensor according to a third embodiment is shown in FIG. 4. At least one of the temperature sensor chip 19 or the lead wire 22 is insert-molded into the inlet port 14. Therefore, the temperature sensor 24 is supported by both the inlet port 14 and the connection portion 23, so that the vibration of the temperature sensor 24 is reduced. Accordingly, the endurance of the temperature sensor 24 is increased.

Although the lead wire 22 of the temperature sensor 24 is inserted into the inlet port 14, both the temperature sensor chip 19 and the lead wire 22 are inserted into the inlet port 14. In this case, since the temperature sensor chip 19 detects the temperature through the inner wall of the inlet port 14, the response of the temperature sensor chip 19 is reduced. Therefore, it is preferred that the temperature sensor 24 is inserted into the inlet port 14 so as to detect the temperature directly by the temperature sensor chip 19.

As shown in FIG. 4, the connection portion 23 for connecting between the lead wire 22 and the connector pin 12 is disposed outside the pressure chamber 15. In the pressure sensor 1 shown in FIG. 1, the connection portion 23 is disposed in the pressure chamber 15. In this case, the potting member 13 is made of fluorine resin having high chemical resistance for protecting the connection portion 23 from the contamination such as oil or moisture contaminated in the pressure chamber 15 through the pressure introduction passage 18a.

However, in the pressure sensor 300, the temperature sensor 24 is insert-molded into the inlet port 14. Therefore, the temperature sensor 24 is not required to determine a position of the temperature sensor 24 in the temperature sensor chamber 18b. Thus, the lead wire 22 of the temperature sensor 24 extends outside the pressure chamber 15 to an accommodation portion 30 through the adhesive 16, which fixes the inlet port 14 to the sensor casing 3. The accommodation portion 30 is disposed in the sensor casing 3. The lead wire 22 is easily connected to the connector pin 12 at the accommodation portion 30. Therefore, the connection portion 23 is separated from the pressure chamber 15 by the adhesive 16, so that the connection portion 23 is not contaminated by the contamination such as oil or moisture. Thus, the potting member 13 can be formed of epoxy resin or silicon resin, which has less chemical resistance less than that of the fluorine resin, and is less expensive less than the fluorine resin.

Although the lead wire 22 connects to the connector pin 12 at the accommodation portion 30 through the adhesive 16, the lead wire 22 can directly connect to the connector pin 12 without passing through the adhesive 16. Here, the lead wire 22 extends from the inlet port 14 to the accommodation portion 30.

(Fourth Embodiment)

Figure 5A:
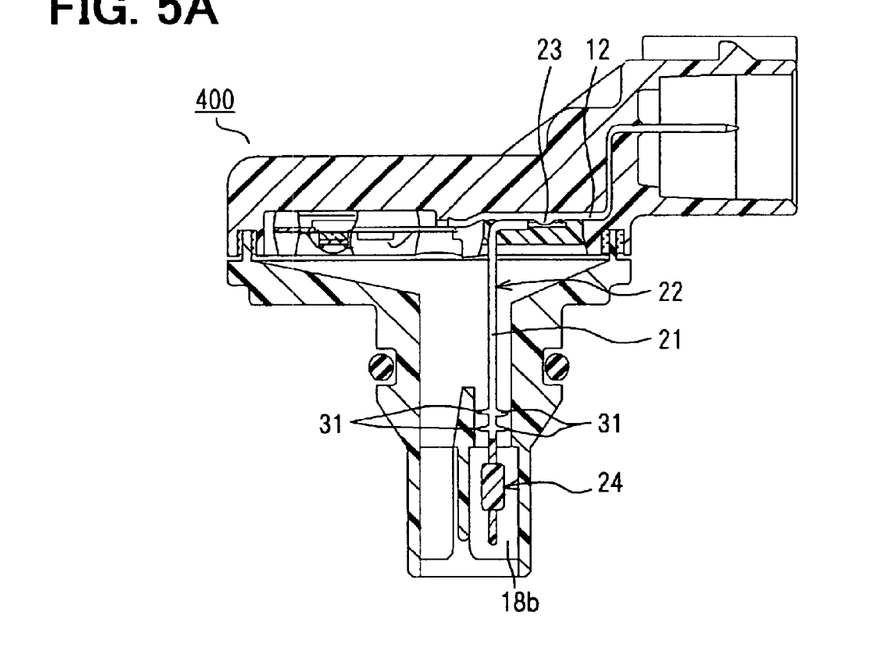
FIGS. 5A and 5B are cross-sectional views showing a pressure sensor device according to a fourth embodiment of the present invention.
Figure 5B:
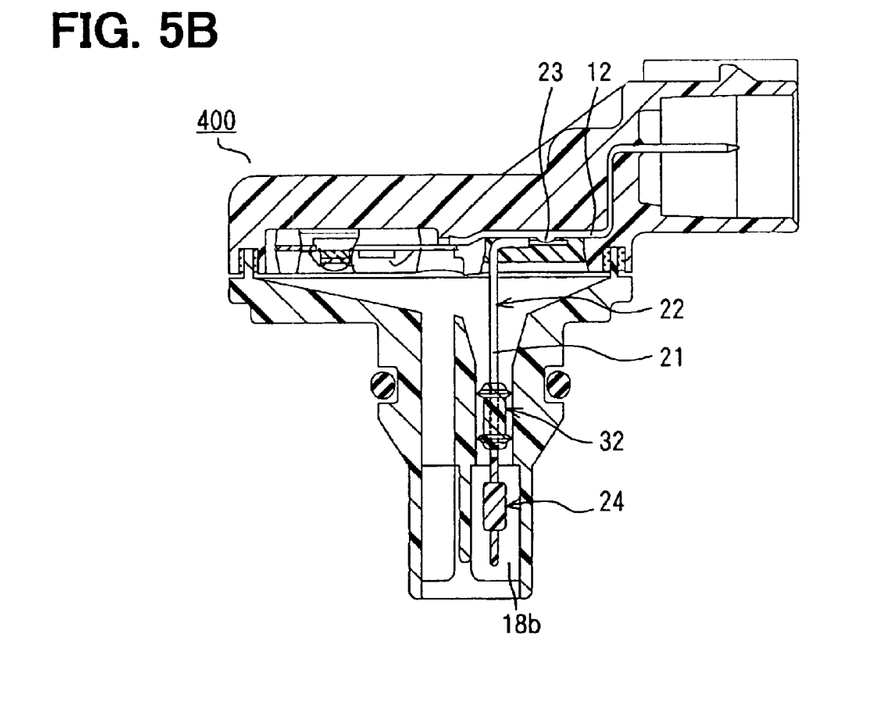

A pressure sensor device 400 having a temperature sensor according to a fourth embodiment is shown in FIG. 5. The lead wire 22 of the temperature sensor 24 has a protrusion 31 for suppressing the vibration of the temperature sensor 24. Particularly, the protrusion 31 is disposed on the protection tube 32 of the lead wire 22, and protrudes in a direction perpendicular to a longitudinal direction of the lead wire 22. The protrusion 31 is made of the same material as the protection tube 21 is made, so that both the protrusion and the protection tube 21 are integrally formed of resin such as polyimide.

A length of the protrusion in the perpendicular direction is equal to a distance between the lead wire 22 and the inner wall of the temperature sensor chamber 18b. Preferably, the length of the protrusion is a little smaller than the distance between the lead wire 22 and the inner wall. That is because the lead wire 22 with the protrusion 31 is easily mounted in a case where the temperature sensor 24 is set in the temperature sensor chamber 18b. In this case, amplitude of vibration of the temperature sensor 24 is substantially zero, so that the vibration of the temperature sensor 24 is reduced.

Preferably, the protrusion 31 has a plurality of bosses. If the protrusion 31 has only one boss, the stress is applied to the only one boss in a case where the temperature sensor 24 is vibrated. Therefore, the protrusion 31 may be broken easily. More preferably, a plurality of bosses is disposed in a same plane perpendicular to the longitudinal direction of the lead wire 22. Furthermore preferably, each protrusion in the same plane is disposed at even angular intervals, i.e., each protrusion is disposed symmetrically. In this case, the protrusion 31 can suppress the vibration of the temperature sensor 24 even if the temperature sensor 24 vibrates to any direction.

As shown in FIG. 5A, when the temperature sensor chamber 18b disposed near the protrusion 31 has the constant diameter, and the protrusion 31 has a plurality of bosses disposed in different planes, it is preferred that the length of each protrusion protruded from the lead wire 22 becomes shorter as the protrusion is disposed near the lower end of the lead wire 22, which is opposite to the connection portion 23. In this case, the stress is applied to a plurality of bosses disposed different planes, when the temperature sensor 24 is vibrated. Therefore, a plurality of bosses hits the inner wall of the temperature sensor chamber 18b, so that the stress is dispersed to a plurality of bosses.

Thus, the lead wire 22 includes the protrusion 31 so that the vibration of the temperature sensor 24 is reduced. Accordingly, the endurance of the temperature sensor 400 is increased.

Although the protrusion 31 has a needle like shape, the protrusion 31 can have another shape such as a disk shape, which is disposed between the lead wire 22 and the inner wall of the temperature sensor chamber 18b so that the vibration of the temperature sensor 24 is reduced.

In this embodiment, the protrusion 31 protrudes from the protection tube 21 of the lead wire 22 to the direction perpendicular to the longitudinal direction of the lead wire 22. The protrusion 31 is formed of the same material as the protection tube 21 is formed, and the protrusion 31 and the protection tube 21 are integrally formed. However, the protrusion 31 can be protruded to any direction, not only to the perpendicular direction, and can be formed of a different material different from that of the protection tube 21. Further, the protrusion 31 can be formed independently from the protection tube 21.

As shown in FIG. 5b, a holder 32 instead of the protrusion 31 is used for reducing the vibration of the temperature sensor 24. The protection tube 21 penetrates the holder 32, i.e., the holder 32 covers the protection tube 21. In this case, the holder protruded from the lead wire 22, so that the vibration of the temperature sensor 24 is reduced. Thus, the endurance of the temperature sensor 24 is increased.

(Fifth Embodiment)

Figure 6:
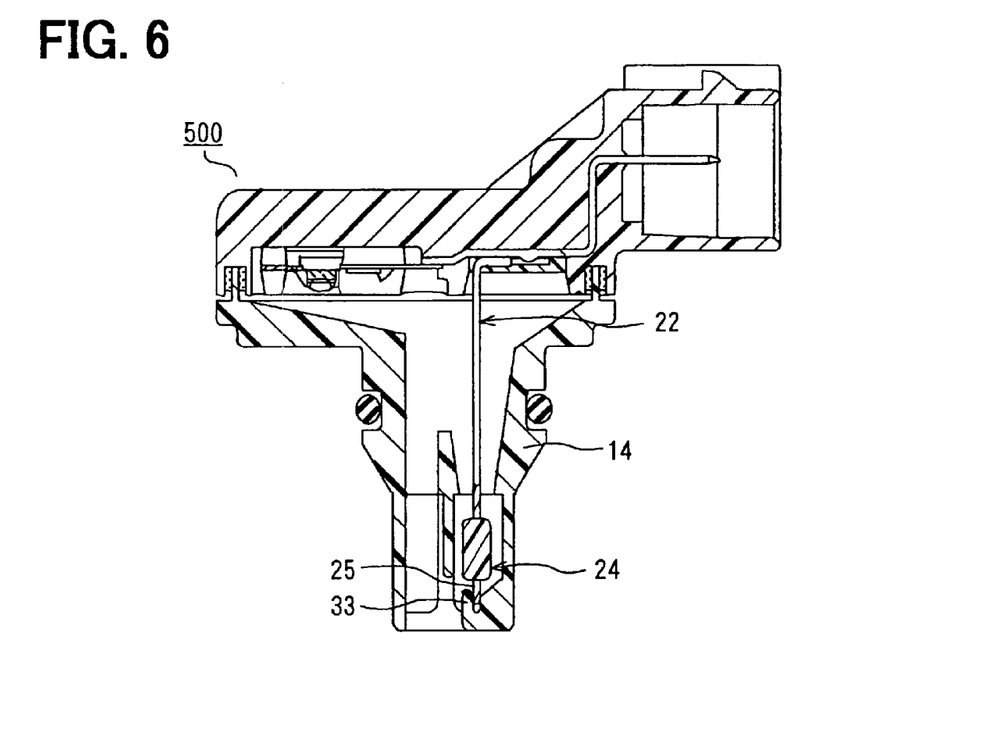
FIG. 6 is a cross-sectional view showing a pressure sensor device according to a fifth embodiment of the present invention.

A pressure sensor device 500 having a temperature sensor according to a fifth embodiment of the present invention is shown in FIG. 6. The pressure sensor device 500 includes a clamp 33 for clamping the lead wire 22. The clamp 33 and the inlet port 14 are integrally formed of resin material. The lead wire 22 is clamped as follows. The clamp 33 is heated so that the clamp 33 melts and clamps the lead wire 22. Thus, the vibration of the temperature sensor 24 is reduced. Moreover, the claim 33 can be formed of another part, which is independent from the inlet port 14. In other words, another part is disposed between the top end of the lead wire 22 and the bottom of the inlet port 14. Another part is heated so as to melt and adhere to both the inlet port 14 and the lead wire 22, so that the lead wire is clamped to the inlet port 14. Thus, the vibration of the temperature sensor 24 is reduced.

Such changes and modifications are to be understood as being within the scope of the present invention as defined by the appended claims.

What is claimed is:

1. A pressure sensor device having a temperature sensor comprising:
   a pressure sensor for detecting pressure of a measuring object;
   a temperature sensor attached to a lead wire for detecting temperature of the measuring object;
   a sensor casing for accommodating a connector pin and the pressure sensor, the connector pin electrically connecting the pressure sensor and an outside circuit;
   a port mounted on the sensor casing and having a pressure introduction port for introducing the measuring object to the pressure sensor disposed in the sensor casing; and
   a vibration reduction means for reducing a vibration of both the temperature sensor and the lead wire, wherein
   the temperature sensor is disposed in the pressure introduction port, and electrically connects to the connector pin through the lead wire,
   both the temperature sensor and the lead wire are supported by a connection portion, which is disposed between the connector pin and the lead wire
   the vibration reduction means is provided by a buffer disposed between the lead wire and a part of the pressure introduction port.

2. The pressure sensor device according to claim 1, wherein the pressure introduction port includes a partition plate for separating at least a part of the pressure introduction port into two parts, the partition plate being disposed along with an introducing direction of the measuring object, and
   wherein one part of the pressure introduction port is a temperature sensor chamber for accommodating the temperature sensor.

3. The pressure sensor device according to claim 2, wherein the buffer is disposed between the lead wire and a part of the temperature sensor chamber.

4. The pressure sensor device according to claim 1, wherein the buffer is made of resin material disposed between the lead wire and a part of the pressure introduction port.

5. The pressure sensor device according to claim 4, wherein the resin material is hot melt adhesive.

6. The pressure sensor device according to claim 1, wherein the buffer is disposed between the lead wire and a part of the pressure introduction port, and is formed of elastic member for fixing the lead wire.

7. The pressure sensor device according to claim 1, wherein the port includes an introduction port for inserting the buffer therethrough.

8. A pressure sensor device having a temperature sensor comprising,
   a pressure sensor for detecting pressure of a measuring object;
   a temperature sensor attached to a lead wire for detecting temperature of the measuring object;
   a sensor casing for accommodating a connector pin and the pressure sensor, the connector pin electrically connecting the pressure sensor and an outside circuit;
   a port mounted on the sensor casing and having a pressure introduction port for introducing the measuring object to the pressure sensor disposed in the sensor casing; and
   a vibration reduction means for reducing a vibration of both the temperature sensor and the lead wire, wherein
   the temperature sensor is disposed in the pressure introduction port, and electrically connects to the connector pin through the lead wire,
   both the temeprature sensor and the lead wire are supported by a connection portion, which is disposed between the connector pin and the lead wire, and
   the vibration reduction means is provded such that at least one of the temperature sensor or the lead wire is insert-molded into the port so as to reduce the vibration.

9. The pressure sensor device according to claim 8, wherein both the sensor casing and the port provide a pressure chamber for introducing the measuring object therein, and wherein the lead wire and the connector pin are connected at a connection portion, which is disposed outside the pressure chamber.

10. The pressure sensor device according to claim 9, wherein the connection portion is covered with epoxy resin or silicon resin.

11. The pressure sensor device according to claim 8, wherein the pressure introduction port includes a partition plate for separating at least a part of the pressure introduction port into two part, the partition plate being disposed along with an introducing direction of the measuring object, and wherein one part of the pressure introduction port is a temperature sensor chamber for accommodating the temperature sensor.

12. A pressure sensor device having a temperature sensor comprising:

a pressure sensor for detecting pressure of a measuring object;

a temperature sensor attached to a lead wire for detecting temperature of the measuring object;

a sensor casing for accommodating a connector pin and the pressure sensor, the connector pin electrically connecting the pressure sensor and an outside circuit;

a port mounted on the sensor casing and having a pressure introduction port for introducing the measuring object to the pressure sensor disposed in the sensor casing; and a viration reduction means for reducing a vibration of both the temperature sensor and the lead wire, wherein the temperature sensor is disposed in the pressure introduction port, and electrically connects to the connector pin through the lead wire, both the temperature sensor and the lead wire are supported by a connection portion, which is disposed between the connector pin and the lead wire, and the vibration reduction means is provided by a protrusion disposed on a surface of the lead wire.

13. A pressure sensor device having a temperature sensor comprising:

a pressure sensor for detecting pressure of a measuring object;

a temperature sensor attached to a lead wire for detecting temperature of the measuring object;

a sensor casing for accommodating a connector pin and the pressure sensor, the connector pin electrically connecting the pressure sensor and an outside circuit;

a port mounted on the sensor casing having a pressure introduction port for introducing the measuring object to the pressure sensor disposed in the sensor casing; and a vibration reduction means for reducing a vibration of both the temperature sensor and the lead wire, wherein the temperature sensor is disposed in the pressure introduction port, and electrically connects to the connector pin throught the lead wire, both the temperature sensor and the lead wire are supported by a connection portion, which is disposed between the connector pin and the lead wire, and the vibration reduction means is provided such that the lead wire is fixed to the port by resin material thermally clamped between the lead wire and the port.

14. A pressure sensor device having a temperature sensor comprising:

a pressure sensor; a temperature sensor attached to a lead wire;

a casing for accommodating the pressure sensor and a connector pin for connecting both the pressure sensor and the temperature sensor to an outside circuit;

a passage disposed in the casing for introducing a measuring object to the pressure sensor; and a vibration reduction means for reducing a vibration of the lead wire with the temperature sensor, wherein the lead wire is supported by a connection portion between the connector pin and the lead wire so that the lead wire is protruded in the passage.

15. The pressure sensor device according to claim 14, wherein the vibration reduction means is provided by a buffer disposed between the lead wire and a part of the passage.

16. The pressure sensor device according to claim 15, wherein the buffer is made of resin material, and wherein the casing further includes an introduction port for introducing the resin material in case of forming the buffer.

17. The pressure sensor device according to claim 16, wherein the resin material is hot melt adhesive.

18. The pressure sensor device according to claim 15, wherein the buffer is formed of a ball-shaped elastic member, and wherein the casing further includes an introduction port for inserting the elastic member in case of forming the buffer.

19. The pressure sensor device according to claim 15, wherein the passage is divided by a partition into two regions, wherein one region of the passage is a pressure introduction passage for introducing the measuring object to the pressure sensor, wherein the other region of the passage is a temperature sensor chamber for accommodating the temperature sensor, and wherein the buffer is disposed in the temperature sensor chamber.

20. The pressure sensor device according to claim 19, wherein the buffer completely closes the temperature sensor chamber.

21. The pressure sensor device according to claim 19, wherein the buffer partially closes the temperature sensor chamber so that the measuring object passes through the buffer.

22. The pressure sensor device according to claim 14, wherein the vibration reduction means is provided such that at least one of the temperature sensor or the lead wire is insert-molded into the casing so as to reduce the vibration.

* * * * *